(12) United States Patent
Kang

(10) Patent No.: US 7,864,571 B2
(45) Date of Patent: Jan. 4, 2011

(54) MEMORY CELL PROGRAMMING METHOD AND SEMICONDUCTOR MEMORY DEVICE

(75) Inventor: Dong-ku Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 389 days.

(21) Appl. No.: 12/017,415

(22) Filed: Jan. 22, 2008

(65) Prior Publication Data
US 2008/0175048 A1    Jul. 24, 2008

(30) Foreign Application Priority Data
Jan. 23, 2007    (KR) .................. 10-2007-0007246

(51) Int. Cl.
*G11C 16/04* (2006.01)
(52) U.S. Cl. .................. 365/185.03; 365/185.05; 365/185.18
(58) Field of Classification Search ............ 365/185.03, 365/185.18, 185.05
See application file for complete search history.

(56) References Cited

U.S. PATENT DOCUMENTS

| 7,298,648 B2 * | 11/2007 | Lee et al. ............... | 365/185.03 |
| 7,457,158 B2 * | 11/2008 | Lee et al. ............... | 365/185.03 |
| 2007/0035995 A1 * | 2/2007 | Crippa et al. .......... | 365/185.03 |

FOREIGN PATENT DOCUMENTS

| JP | 2004118940 | 4/2004 |
| JP | 2004206833 | 7/2004 |
| KR | 1020050007653 A | 1/2005 |

* cited by examiner

Primary Examiner—Tuan T Nguyen
Assistant Examiner—Toan Le
(74) Attorney, Agent, or Firm—Volentine & Whitt, PLLC

(57) ABSTRACT

A memory cell programming method and related semiconductor memory device are disclosed. The method involves receiving and latching first through nth bits of write data in a corresponding plurality of first through nth latches, and programming a kth bit of write data in the memory cell, where k ranges from 2 to n, in relation to first through k−1th bits of write data previously stored in the memory cell.

17 Claims, 8 Drawing Sheets

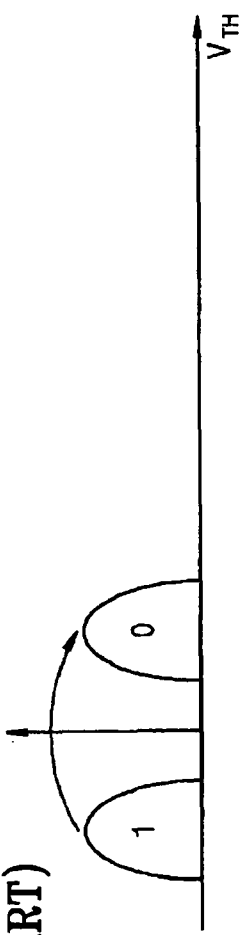
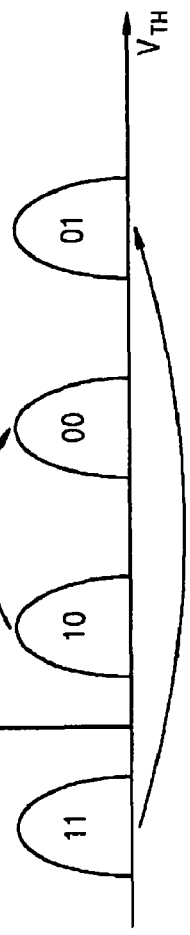
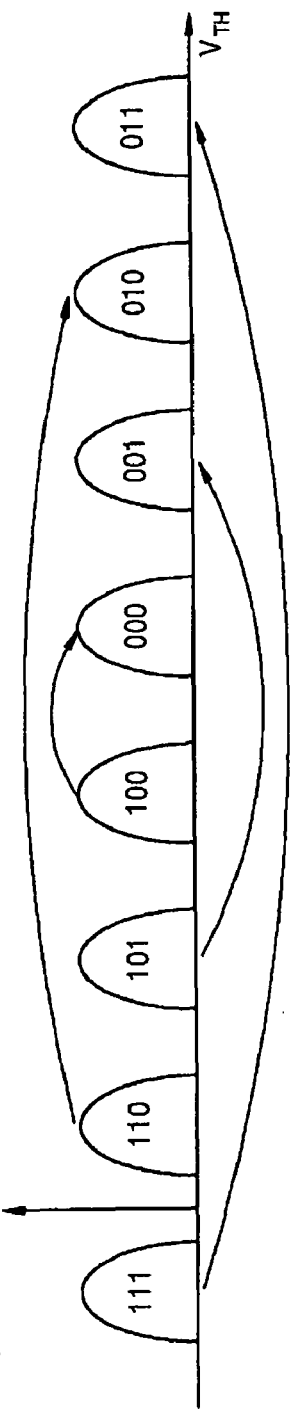
FIG. 3A (PRIOR ART)
FIG. 3B (PRIOR ART)
FIG. 3C (PRIOR ART)

MEMORY CELL PROGRAMMING METHOD AND SEMICONDUCTOR MEMORY DEVICE

CROSS-REFERENCE TO RELATED PATENT APPLICATION

This application claims priority to Korean Patent Application No. 10-2007-0007246 filed on Jan. 23, 2007, the subject matter of which is hereby incorporated by reference.

BACKGROUND OF THE INVENTION

1. Field of the Invention

The present invention relates generally to a memory cell programming method and semiconductor memory device. More particularly, the invention relates to a memory cell programming method and semiconductor memory device capable of programming data in a memory cell without performing an initial read operation.

2. Description of the Related Art

Non-volatile memory devices capable of performing electrical erasing and programming operations may preserve data even when electrical power is interrupted. Flash memory is one representative example of contemporary non-volatile memory devices.

Each memory cell in a flash memory comprises a cell transistor including a control gate, a floating gate, a source, and a drain. The cell transistor is programmed or erased using an electrical charge transfer mechanism called Fowler-Nordheim (F-N) tunneling.

An erase operation for the cell transistor is performed by applying a ground voltage to the control gate and a voltage higher than the source voltage to the constituent semiconductor substrate or transistor bulk. Under this erase bias condition, a strong electric field is formed between the floating gate and bulk due to a large voltage difference between these two elements, thus electrons stored on the floating gate migrate to the bulk due to the F-N tunneling effect. In this case, the threshold voltage of the erased cell transistor is changed in a negative direction.

A programming operation for the cell transistor is performed by applying a voltage higher than the source voltage to the control gate and applying ground voltage to the drain and bulk. Under this program bias condition, electrons are injected onto the floating gate of the cell transistor due to the F-N tunneling effect. In this case, the threshold voltage of the programmed cell transistor is changed in a positive direction.

FIG. 1 is a collection of related diagrams further illustrating the general structure and operation of a memory cell in a conventional non-volatile memory device.

Referring to FIG. 1, and continuing with the working example described above, electrons are accumulated on the floating gate FG of the memory cell during a program operation, and are removed from the floating gate FG during an erase operation. As a result, the threshold voltage of the memory cell transistor following a program operation is greater than 0V, but is less than 0V following an erase operation.

Recently, much research has been conducted in regard to multi-level flash memory in which a plurality of data bits (i.e., two or more) are stored in a single memory cell in order to improve integration of flash memory. A memory cell storing the multi-bit data is referred to as a multi-level cell. On the other hand, a memory cell storing a single bit data is referred to as a single-level cell. A multi-level cell stores multi-bit data using two or more threshold voltage distributions corresponding to two or more data storage states. A case where two-bit data is stored in the multi-level cell is illustrated in FIG. 2, wherein single bit data stored in a single-level cell is illustrated in FIG. 1. However, three or more bits of data may be stored in the multi-level cell.

A conventional multi-level cell storing the two-bit data is capable of being programmed into one of four data states which correspond to stored data values of 11, 01, 10, and 00. The data state corresponding to a stored data value of 11 is commonly designated as an erase state, whereas the data states corresponding to 01, 10, and 00 are programmed states.

Voltage levels associated with the four data states correspond to threshold voltage distributions for the multi-level cell. For example, assuming the threshold voltage distributions are VTH1~VTH2, VTH3~VTH4, VTH5~VTH6, and VTH7~VTH8, the data states 11, 01, 10, and 00 correspond to the threshold voltage distributions VTH1~VTH2, VTH3~VTH4, VTH5~VTH6, and VTH7~VTH8, respectively. That is, a threshold voltage of the multi-level cell corresponds to one of the threshold voltage distributions VTH1~VTH2, VTH3~VTH4, VTH5~VTH6, and VTH7~VTH8, and two-bit data corresponding to one of the data states 11, 01, 10, and 00 is stored in the multi-level cell.

The diagrams shown in FIG. 2 further illustrates the programming of multiple data states (1st through 4th) in relation to respective electron accumulations on a floating gate FG formed between a transistor bulk (e.g., a P+ substrate) and a control gate CG.

Referring FIG. 2, an erase (or first) state is defined as one in which few (e.g., a practical minimum) electrons are accumulated on the floating gate FG of the multi-level cell. The various program states (second through fourth) are defined by progressively more electrons accumulated on the floating gate FG. As the quantity of charge accumulates on the floating gate FG, the threshold voltage of the multi-level cell increases. Thus, the threshold voltage distributions for the multi-level cell increase from the erase state through the various program states in accordance with the quantity of charge accumulated on the floating gate.

As is well understood in the art, once multi-bit data has been written to a multi-level cell, said data must be verified. That is, the actual threshold voltage of the multi-level cell is verified following a program operation to determine whether it is consistent with an intended data state.

FIG. 3A illustrates an operation programming single bit data in a conventional non-volatile memory cell. In contrast, FIG. 3B illustrates an operation programming 2-bit data in a multi-level cell, and FIG. 3C illustrates an operation programming 3-bit data in a multi-level cell.

As is conventionally understood, a single bit memory cell may be programmed into one of two data states, reset and set, or "1" and "0".

However, referring to FIG. 3B, when a second of two data bits is programmed, the corresponding threshold voltage distribution for the second bit will be determined in relation to the data state of the first data (e.g., 1 or 0). For example, if the first bit is 1 and the second bit is 0, an initial threshold voltage distribution corresponding to a data state of 11 is changed to a threshold voltage distribution corresponding to a data state of 01. On the other hand, if the first bit is 0 and the second bit is also 0, a threshold voltage distribution corresponding to a data state of 10 is changed to a threshold voltage distribution corresponding to a data state of 00. Thus, this later transition of threshold voltage from 10 to 00 may sequentially follow a preceding threshold voltage distribution transition from 11 to 10. This sequential transitioning of data state related threshold voltage distributions requires that the former bit (e.g., a first bit in the working example) be "read" following its programming in order to program the second data bit.

Referring now to FIG. 3C, when a third bit is programmed, the threshold voltage distribution corresponding to the third data bit must be determined in relation to both of the first and second data bits. This requires read-back of the first and second data bits.

The number of read-back operations increases as the number of data bits being stored in a multi-level memory cell increase. Such read-back operations take a considerable amount of time and slow the overall speed of the multi-bit programming operation.

SUMMARY OF THE INVENTION

Embodiments of the invention provide a memory cell programming method capable of programming data in a memory cell without performing data bit read-back operations. Embodiments of the invention also provide a semiconductor memory device capable of programming data in a memory cell without performing data read-back operations.

In one embodiment, the invention provides a method of programming multi-bit data in a memory cell, comprising; respectively receiving and latching first through nth bits of write data in a corresponding plurality of first through nth latches, and programming a kth bit of write data in the memory cell, where k ranges from 2 to n, in relation to first through k−1th bits of write data previously stored in the memory cell.

In another embodiment, the invention provides a method of programming multi-bit data in a memory cell, the memory cell being arranged in a memory cell array of a semiconductor memory device comprising a sequentially related plurality of first through nth latches, the method comprising; receiving and latching a kth bit of write data in the first latch, where k is a natural number ranging from 1 to n and programming the kth bit of data in the memory cell from the first latch, transferring the kth bit of write data to a second latch in the plurality of latches, and receiving and latching a kth+1 bit of write data in the first latch, and programming the kth+1 bit of write data in the memory cell from the first latch in relation to the kth bit of write data latched in the second latch.

In another embodiment, the invention provides a semiconductor memory device comprising; a multi-level memory cell configured to store first through nth bits of write data, and a plurality of first through nth latches, each one of the plurality of first through nth latches being configured to receive and latch a corresponding one of the first through nth bits of write data, wherein the plurality of first through nth latches are further configured to sequentially program a kth bit of write data, where k is a natural number ranging from 2 to n, in the memory cell in relation to first through k−1th bits of write data previously programmed to the memory cell.

BRIEF DESCRIPTION OF THE DRAWINGS

FIG. 3A is a graph illustrating a single bit programming operation;

FIG. 3B is a graph illustrating a 2-bit data programming operation in a non-volatile multi-level cell;

FIG. 3C is a graph illustrating a 3-bit programming operation in a non-volatile multi-level cell;

DESCRIPTION OF EMBODIMENTS

Embodiments of the invention will be described with reference to the accompanying drawings. Throughout the drawings and the written description, like reference numbers and legends are used to indicate like or similar features.

Figure 1:
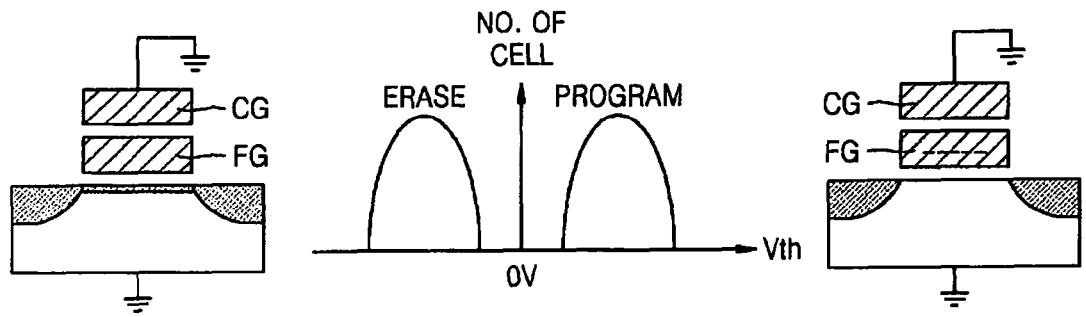
FIG. 1 is a diagram of a conventional single bit non-volatile memory cell and a related programming operation.
Figure 2:
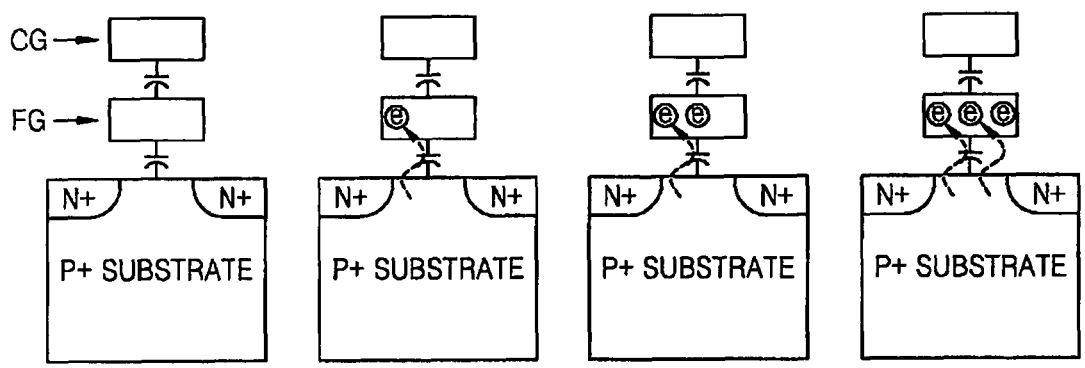
FIG. 2 is a conceptual diagram of a multi-bit programming operation for a non-volatile multi-level memory cell.
Figure 4:
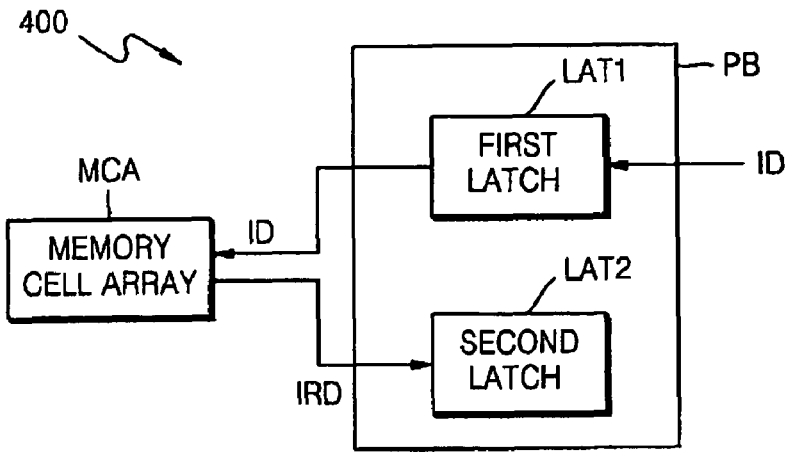
FIG. 4 is a block diagram of a semiconductor memory device programming data in a memory cell using a read-back operation and is presented as a comparative example relative to embodiments of the invention.

FIG. 4 is a block diagram of a semiconductor memory device 400 capable of programming data in a memory cell using a read-back operation, and is presented as a comparative example to embodiments of the invention.

Referring to FIG. 4, semiconductor memory device 400 includes a memory cell array MCA, a first latch LAT1, and a second latch LAT2. Each memory cell in the memory cell array MCA is configured to store multi-bit input (or write) data ID. The first latch LAT1 receives and latches a first bit of the write data ID being written to a memory cell in memory cell array MCA. The first bit latched in the first latch LAT1 is then written to the memory cell.

While the first bit is being written to the memory cell, the first latch LAT1 receives and latches a second bit of write data ID. The second latch LAT2 receives and latches read-back data IRD (i.e., the current data state of the memory cell being programmed with write data). The read-back data IRD will reflect the value of the first bit of write data already programmed in the memory cell. The second bit of write data ID latched in the first latch LAT1 may now be programmed in the memory cell with reference to the read-back data IRD latched in the second latch LAT2.

Figure 5:
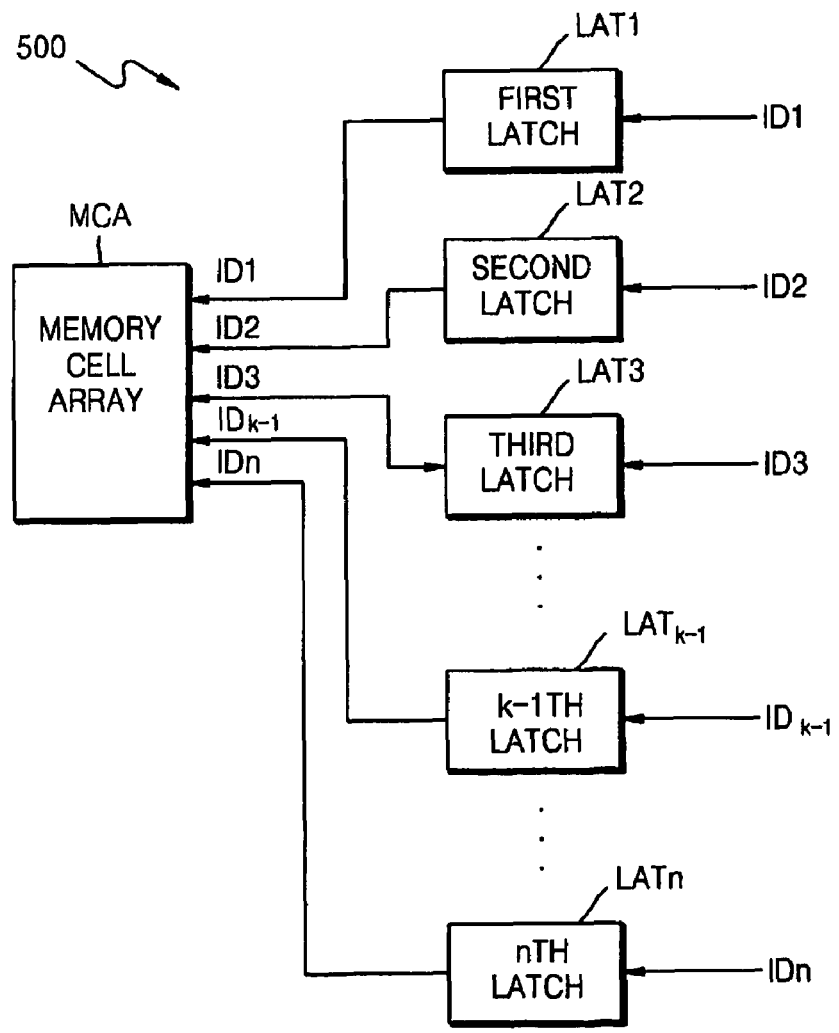
FIG. 5 is a block diagram of a semiconductor memory device capable of programming data in a memory cell without performing a read-back operation according to an embodiment of the invention.

FIG. 5 is a block diagram of a semiconductor memory device 500 capable of programming data in a memory cell without performing a read-back operation according to an embodiment of the invention.

Referring to FIG. 5, the semiconductor memory device 500 generally comprises a memory cell array MCA including a plurality of multi-bit memory cells, and first through nth latches LAT1 through LATn, where "n" is a natural number greater than one.

A kth latch LATk, where "k" is a natural number less than or equal to "n", receives and latches a kth bit IDk of write data. Thus, a first latch LAT1 receives and latches a first bit ID1 of write data, a second latch LAT2 receives and latches a second bit ID2 of write data, a third latch LAT3 receives and latches a third bit ID3 of write data, and an nth latch LATn receives and latches an nth bit IDn of write data.

Each kth bit IDk or write data latched in a corresponding kth latch LATk may be sequentially programmed in a memory cell in relation to (i.e., with reference to) the first ID1 through k−1th IDk−1 bits of write data latched in respective first through k−1th latches LAT1 through LATk−1.

By way of comparison, in the semiconductor memory device 400 illustrated in FIG. 4, in order to program a kth bit IDk of write data in the memory cell, the data state of all previously programmed bits of write data (i.e., first ID1 through k−1th IDk−1 bits of write data) must be read-back from the memory cell. However, in the semiconductor memory device 500 consistent with an embodiment of the invention, each previously programmed bit of write data (i.e., first ID1 through k−1th IDk−1 bits of write data) before a kth bit of write data remains apparent in a corresponding latch (i.e., the first latch LAT1 through the k−1th LATk−1 latch). Thus, a current bit of write data (e.g., a kth bit of write data) may be programmed in the memory cell with reference to each previously programmed bit of write data (e.g., first ID1 through k−1th IDk−1 bits) without requirement of one or more read-back operations applied to the memory cell. This ability greatly enhances the overall speed of the constituent programming operation.

The first through nth latches LAT1 through LATn may be implemented within a page buffer of semiconductor memory device 500. Alternatively, the first through nth latches LAT1 through LATn may be provided separate from page buffer circuitry. For example, the first through nth latches LAT1 through LATn may be included as part of a cache or intermediate memory within semiconductor memory device 500. Alternately, a cache or intermediate data memory including the first through nth latches LAT1 through LATn may be implemented outside of semiconductor memory device 500.

As noted above, the plurality of memory cells in a memory array susceptible to the benefits of the present invention may be non-volatile memory cells, such as conventional flash memory cells configured to store multi-bit data.

Figure 6:
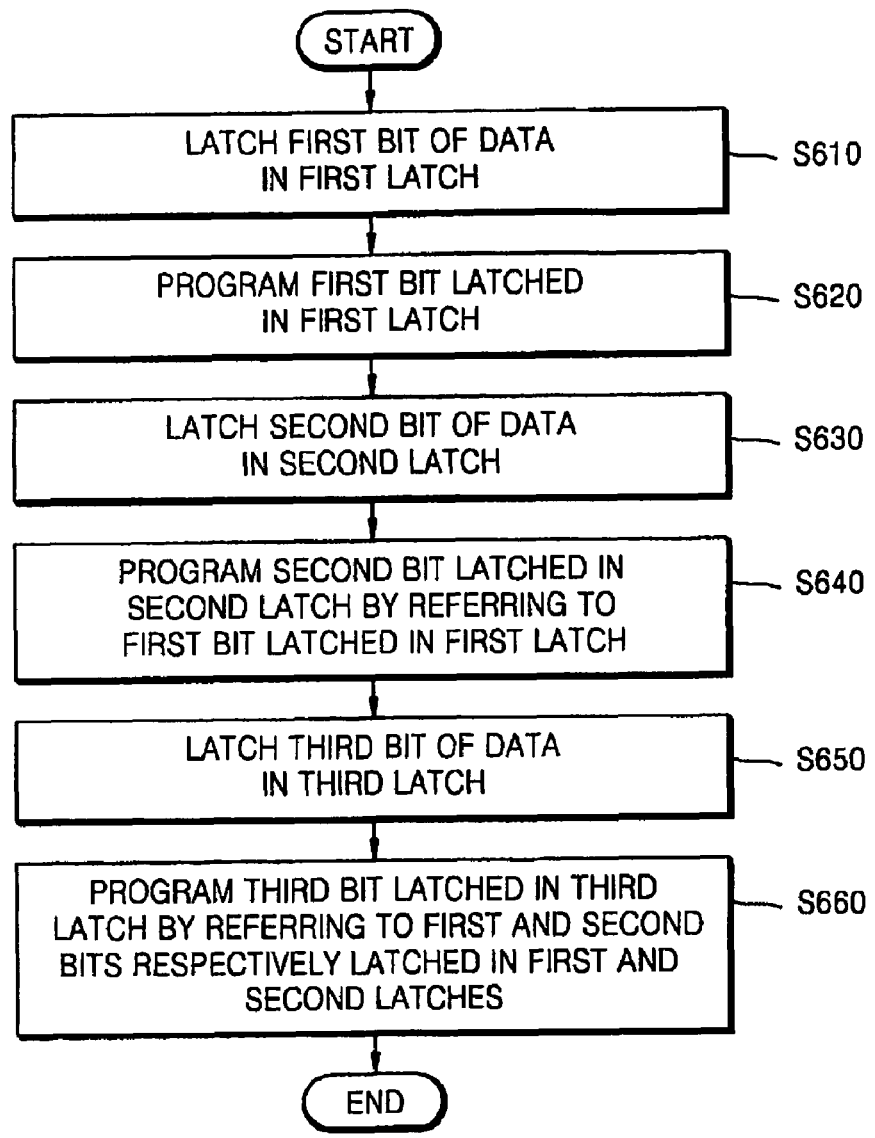
FIG. 6 is a flowchart summarizing a memory cell programming method capable of programming data in a memory cell without performing a read-back operation according to an embodiment of the invention.

FIG. 6 is a flowchart summarizing a method of programming 3-bit data into a memory cell without the requirement of performing a read-back operation according to an embodiment of the invention. That is, relative to the example illustrated in FIG. 5, the method of FIG. 6 assumes that "n" is equal to 3. However, those of ordinary skill in the art will be able to extrapolate from this example other embodiments of the invention drawn to other multi-bit data.

In the memory cell programming method of FIG. 6, 3-bit data is programmed in a multi-bit memory cell of a semiconductor memory device including first through 3rd latches. Thus, "k" ranges from 1 to 3 in the illustrated example.

The memory cell programming method begins by latching a first bit of write data ID1 in a first latch LAT1 (S610) and then programming the first bit of write data ID1 latched in the first latch to the memory cell (S620). A second bit of write data ID2 is latched in second latch LAT2 (S630). The provision and latching of the second bit of write data ID2 may proceed in parallel with (or partially in parallel with) the latching of the first bit of write data ID1 and/or its programming to the memory cell. This is true of all sequentially related bits of write data, and may reduce data latency associated with the programming of the write data.

The second bit of write data ID2 latched in the second latch LAT2 is then programmed to the memory cell in relation to the first bit of write data ID1 which remains latched in the first latch LAT1 (S640). Then, a third bit of write data ID3 is latched into a corresponding third latch LAT3 (S650), and subsequently programmed to the memory cell in relation to the first bit of write data ID1 latched in the first latch LAT1 and the second bit of write data ID2 latched in the second latch LAT2 (S660).

In one embodiment of the invention consistent with the illustrated example of FIG. 6, it may be assumed that the first bit of write data ID1 is a most significant bit (MSB) within the write data, and that the third (i.e., the nth) bit of write data ID3 is a least significant bit (LSB) of write data.

FIGS. 7A through 7D are conceptual diagrams further describing a semiconductor memory device and a related memory cell programming method according to an embodiment of the invention. For convenience of explanation in relation to FIGS. 7A through 7D, a 4-bit data programming operation is assumed as an example.

Figure 7A:
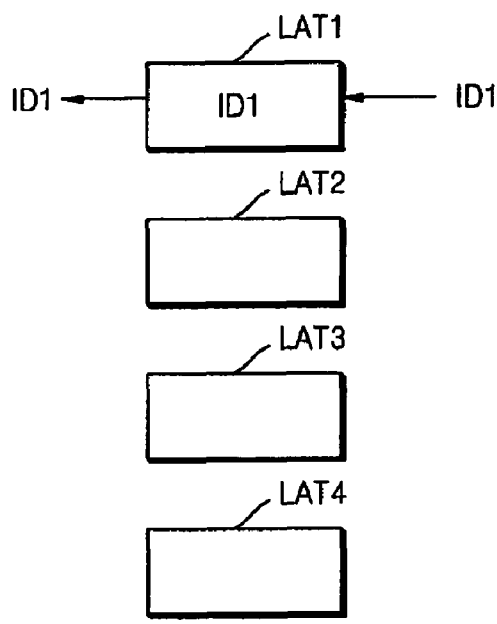
FIGS. 7A through 7D are conceptual diagrams further describing a semiconductor memory device and related memory cell programming method according to an embodiment of the invention.

Referring to FIG. 7A, a first bit of write data ID1 is latched in a first latch LAT1 and then programmed in a memory cell (not shown).

Figure 7B:
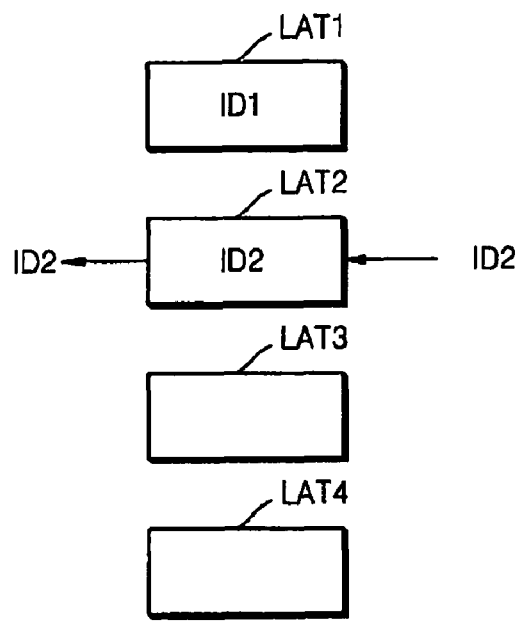

Referring to FIG. 7B, a second bit of write data ID2 is latched in a second latch LAT2. Then, the second bit ID2 latched in the second latch LAT2 is programmed in the memory cell by referring to the first bit ID1 latched in the first latch LAT1.

Figure 7C:
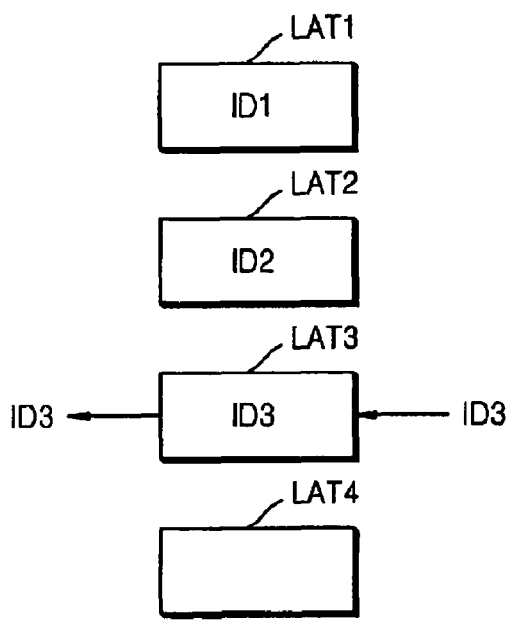

Referring to FIG. 7C, a third bit of write data ID3 is latched in a third latch LAT3. Then, the third bit ID3 latched in the third latch LAT3 is programmed in the memory cell by referring to the first and second bits ID1 and ID2 latched in the first and second latches LAT1 and LAT2.

Figure 7D:
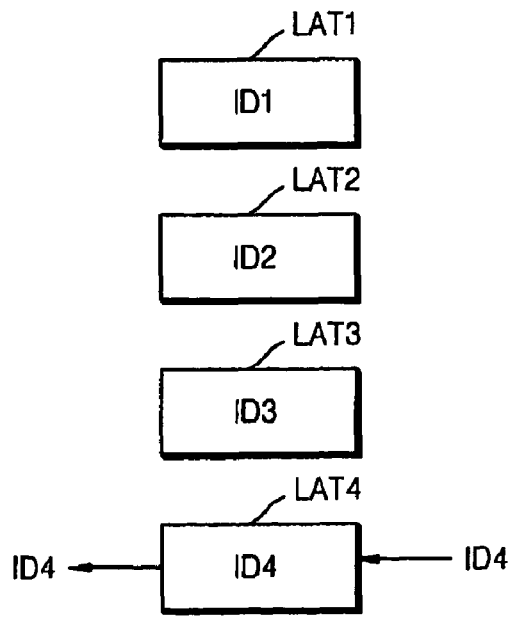

Referring to FIG. 7D, a fourth bit of write data ID4 is latched in a fourth latch LAT4. Then, the fourth bit ID4 latched in the fourth latch LAT4 is programmed in the memory cell by referring to the first through third bits ID1 through ID3 latched in the first through third latches LAT1 through LAT3.

Figure 8:
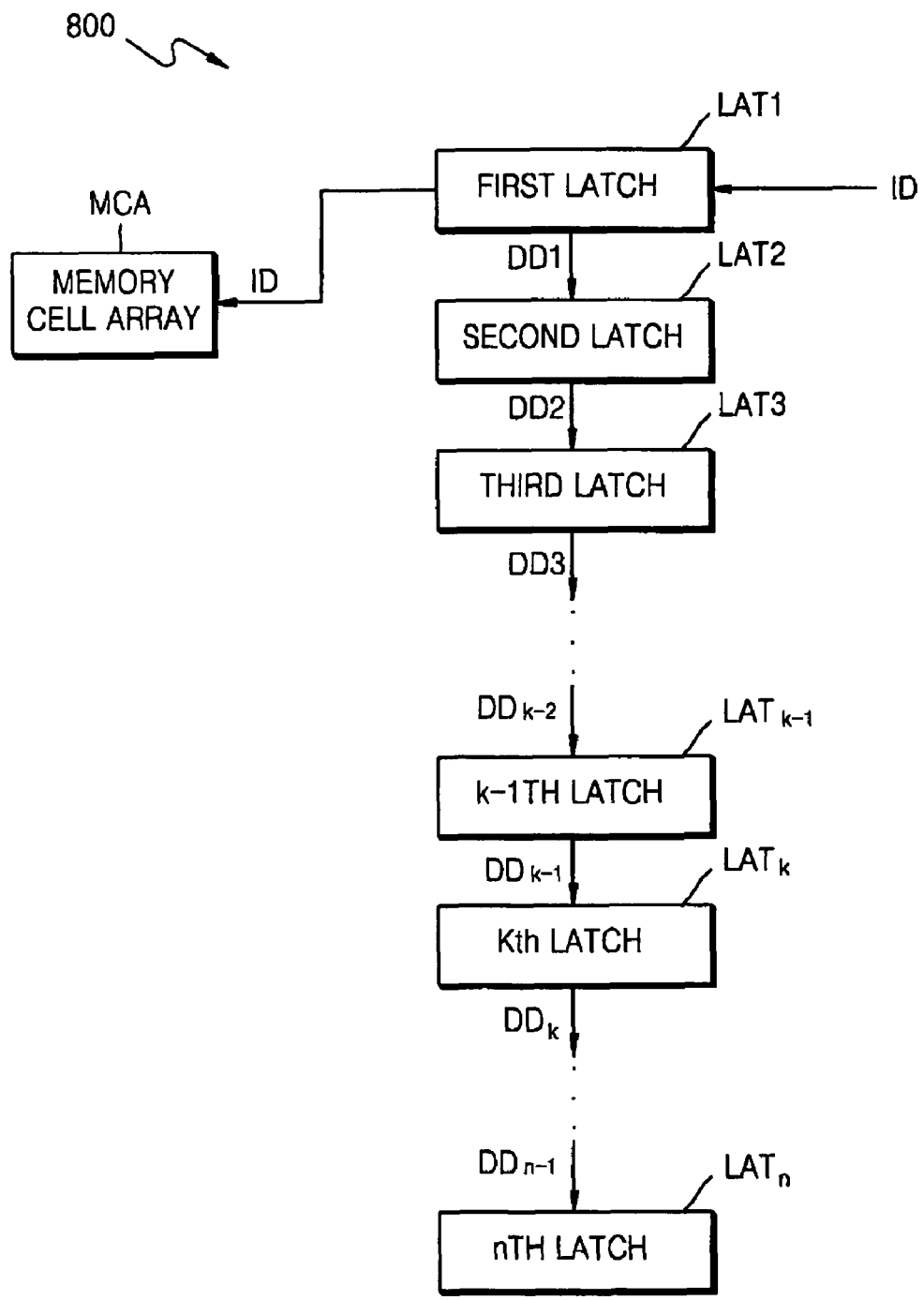
FIG. 8 is a block diagram of a semiconductor memory device capable of programming data in a memory cell without performing a read-back operation according to another embodiment of the invention.

FIG. 8 is a block diagram of a semiconductor memory device programming multi-bit data in a memory cell without performing a read-back operation according to another embodiment of the invention.

Referring to FIG. 8, a semiconductor memory device 800 comprises a memory cell array MCA including one or more memory cells, and a plurality of first through nth latches LAT1 through LATn.

The first latch LAT1 in semiconductor memory device 800 receives each current bit of write data ID from an external source and latches it. All other latches in the plurality of latches (i.e., the second latch LAT2 through nth latch LATn) receive write data from the first latch LAT1 through 0 to n−1 intermediate latches. Thus, the plurality of latches may be seen as a push down or first-in-last-out memory stack.

Thus, a current bit of write data (i.e., a "kth" bit of write data being currently programmed to the memory cell) is latched into first latch LAT1 and subsequently programmed to the memory cell. However, this programming may be performed in relation to any preceding first through k−1th bits of write data previously programmed, yet still apparent in the stacked plurality of latches. Here again, since the successive values of all previously programmed bits of write data (i.e., the first through k−1th bits of write data) are readily accessible to the programming operation, a current kth bit of write data may be programmed to the memory cell without requirement of reading-back one or more of the previously programmed bits of write data.

Thus, where the embodiment of the invention illustrated in FIG. 5 is configured as a parallel arrangement of latches each receiving a corresponding bit of write data, the embodiment illustrated in FIG. 8 comprises only a single latch circuit (LAT1) sequentially receiving each bit of write data and where the received (or current) bit of write data is not the last (or nth) bit of write data, it is pushed onto the stack of latches after being programmed for subsequent reference during the programming of all later programmed bits of write data.

Like the embodiment illustrated in FIG. 5, the embodiment of the invention illustrated in FIG. 8 reduces the overall time required to perform a complete programming operation.

Figure 9:
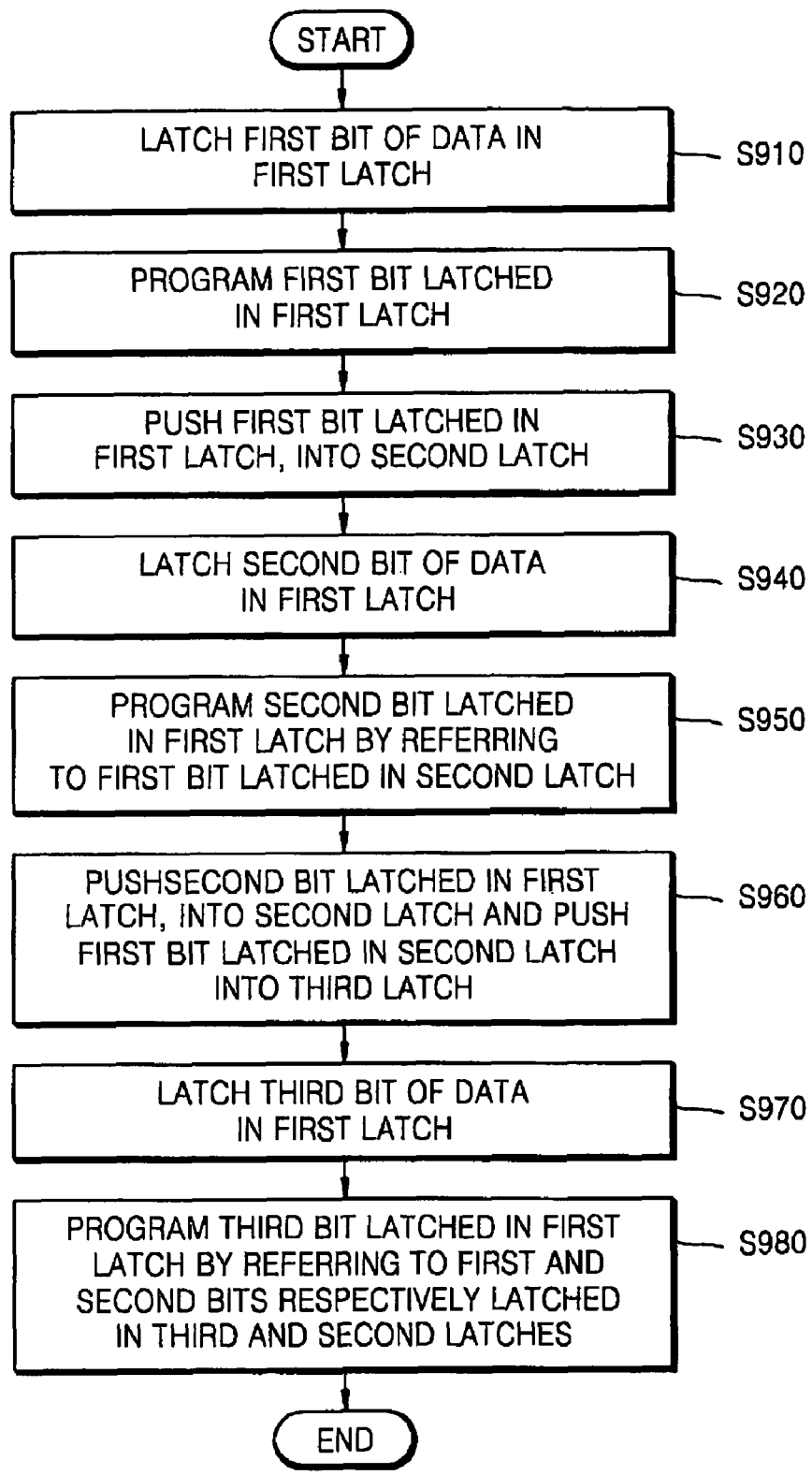
FIG. 9 is a flowchart summarizing a memory cell programming method of programming data in a memory cell without performing a read-back operation according to another embodiment of the invention.

FIG. 9 is a flowchart summarizing a method of programming multi-bit data in memory cell without performing a read-back operation according to another embodiment of the invention. Here again, for convenience of explanation, the exemplary programming operation is drawn to 3-bit data.

In the memory cell programming method of FIG. 6, 3-bit data is programmed in a multi-bit memory cell of a semiconductor memory device including first through 3rd latches. Thus, "k" ranges from 1 to 3 in the illustrated example.

The memory cell programming method begins by latching a first bit of write data ID1 in a first latch LAT1 (S910) and then programming the first bit of write data ID1 latched in the first latch to the memory cell (S920). The first bit of write data ID1 is pushed into the second latch LAT2 (S930) and a second bit of write data ID2 is then latched in first latch LAT1 (S940). The second bit of write data ID2 latched in the first latch LAT1 may now be programmed to the memory cell in relation to the first bit of write data ID1 which is latched in the second latch LAT2 (S950). The second bit of write data ID2 is then pushed into the second latch LAT2 and the first bit of write data ID1 is pushed into the third latch LAT3 (S960). Then, a third bit of write data ID3 is latched in first latch LAT1 (S970). The third bit of write data ID3 latched in the first latch LAT1 may now be programmed to the memory cell in relation to the first bit of write data ID1 which is latched in the third latch LAT3 and the second bit of write data ID2 latched in the second latch LAT2 (S980).

Here again, in one embodiment of the invention consistent with the illustrated example of FIG. 8, it may be assumed that the first bit of write data ID1 is a most significant bit (MSB) within the write data, and that the third (i.e., the nth) bit of write data ID3 is a least significant bit (LSB) of write data.

FIGS. 10A through 10D are conceptual diagrams further describing a semiconductor memory device and a related memory cell programming method according to another embodiment of the invention.

Here again, for convenience of explanation, a programming operation related to 4-bit data is assumed as an example.

Figure 10A:
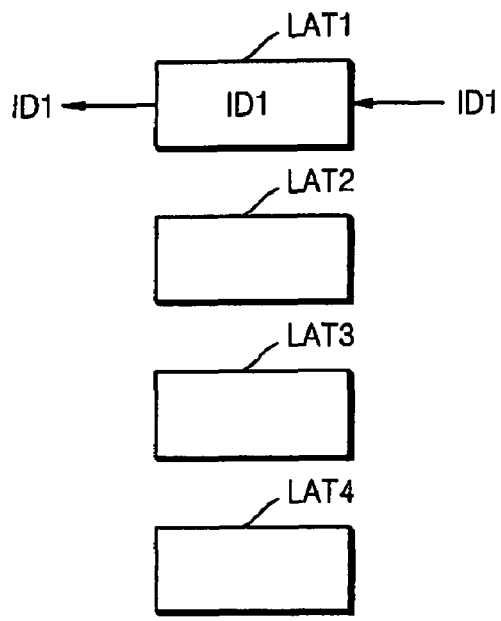
FIGS. 10A through 10D are conceptual diagrams further describing a semiconductor memory device and a related memory cell programming method according to another embodiment of the invention.

Referring to FIG. 10A, a first bit of write data ID1 is latched in a first latch LAT1 and is then programmed in a memory cell (not shown).

Figure 10B:
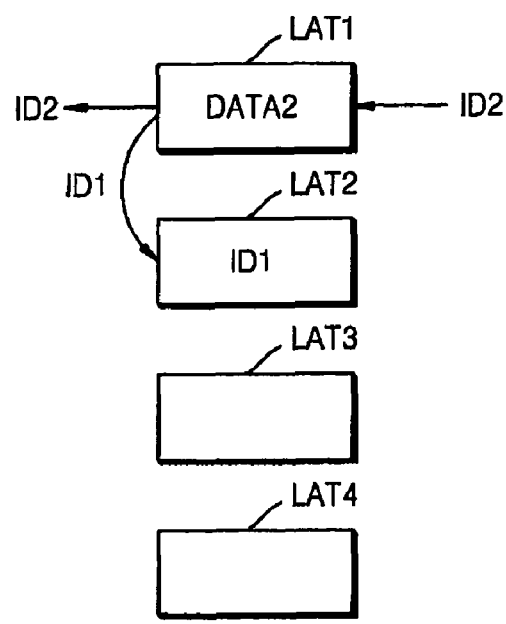

Referring to FIG. 10B, the first bit of write data ID1 is pushed from the first latch LAT1 to a second latch LAT2. Then, a second bit of the write data ID2 is received by and latched in the first latch LAT1. Then, the second bit of write data ID2 latched in the first latch LAT1 is programmed in the memory cell by referring to the first bit ID1 latched in the second latch LAT2.

Figure 10C:
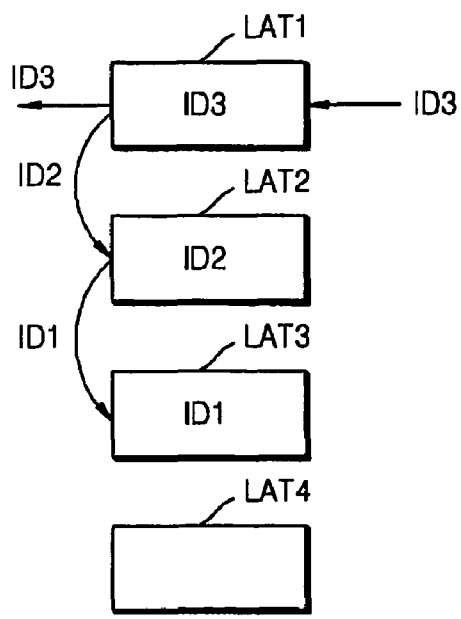

Referring to FIG. 10C, the second and first bits ID2 and ID1 latched in the first and second latches LAT1 and LAT2 are respectively pushed to and latched in the second latch LAT2 and a third latch LAT3. Then, a third bit of the write data ID3 is received by and latched in the first latch LAT1. Then, the third bit of write data ID3 latched in the first latch LAT1 is programmed in the memory cell by referring to the second and first bits ID2 and ID1 respectively latched in the second and third latches LAT2 and LAT3.

Figure 10D:
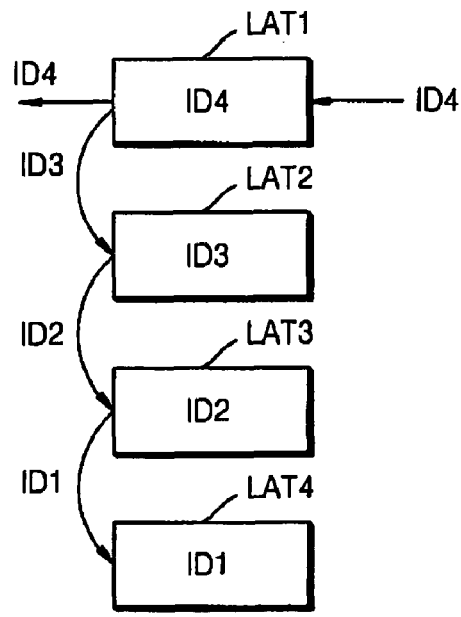

Referring to FIG. 10D, the third, second, and first bits of write data ID3, ID2, and ID1 latched in the first through third latches LAT1 through LAT3 are transferred to and latched in the second and third latches LAT2 and LAT3 and a fourth latch LAT4, respectively. Then, a fourth bit of write data ID4 is received by and latched in the first latch LAT1. Then, the fourth bit ID4 latched in the first latch LAT1 is programmed in the memory cell by referring to the third, second, and first bits ID3, ID2, and ID1 respectively latched in the second through fourth latches LAT2 through LAT4.

As described above, according to an embodiment of the invention, multi-bit data may be programmed on a bit-by bit basis to a multi-level memory cell without requirement for one or more read-back operations. Yet, such programming may proceed with full reference to previously programmed bits of write data. Therefore, the time required to program the multi-bit data in the memory cell is reduced.

While the present invention has been particularly shown and described with reference to exemplary embodiments thereof, it will be understood by those of ordinary skill in the art that various changes in form and details may be made therein without departing from the scope of the invention as defined by the appended claims.

What is claimed is:

1. A method of programming multi-bit data in a memory cell, comprising:
   respectively receiving and latching first through nth bits of write data in a corresponding plurality of first through nth latches;
   programming first bit of write data latched in the first latch in the memory cell; and then,
   programming a kth bit of write data in the memory cell, where k ranges from 2 to n, by referring to the first through k–1th bits previously latched in the first through k–1th latches.

2. The method of claim 1, further comprising:
   comparing k to n after programming the kth bit of write data in the memory cell; and
   where k is less than n, incrementing k and then programming a kth bit of write data in the memory cell in relation to the first through k–1th bits of write data previously stored in the memory cell.

3. The method of claim 1, wherein the first bit of write data is a most significant bit (MSB) of write data, and the nth bit of write data is a least significant bit (LSB) of write data.

4. The method of claim 1, wherein the memory cell is a non-volatile memory cell.

5. The method of claim 4, wherein the memory cell is a multi-level flash memory cell.

6. A method of programming multi-bit data in a memory cell, the memory cell being arranged in a memory cell array of a semiconductor memory device comprising a sequentially related plurality of first through nth latches, the method comprising:
   receiving and latching a kth bit of write data in the first latch, where k is a natural number ranging from 1 to n and programming the kth bit of data in the memory cell from the first latch;
   transferring the kth bit of write data to a second latch in the plurality of latches, and receiving and latching a kth+1 bit of write data in the first latch; and then,
   programming the kth+1 bit of write data in the memory cell from the first latch by referring to the kth bit of write data latched in the second latch.

7. The method of claim 6, further comprising:
comparing k to n after the programming of the kth bit in the memory cell from the first latch, and upon determining that k=n, ending the programming method.

8. The method of claim 6, wherein the first bit of write data is a most significant bit (MSB) of write data, and the nth bit of write data is a least significant bit (LSB) of write data.

9. The method of claim 6, wherein the memory cell is a non-volatile memory cell.

10. The method of claim 9, wherein the memory cell is a multi-level flash memory cell.

11. A semiconductor memory device comprising:
a multi-level memory cell configured to store first through nth bits of write data; and
a plurality of first through nth latches, each one of the plurality of first through nth latches being configured to receive and latch a corresponding one of the first through nth bits of write data,
wherein the plurality of first through nth latches are further configured to program the first bit of write data latched in the first latch in the memory cell, and then sequentially program a kth bit of write data, where k is a natural number ranging from 2 to n, in the memory cell by referring to the first through k−1th bits of write data previously latched in the first through k−1th latches.

12. The device of claim 11, wherein the plurality of first through nth latches is arranged in parallel and each one of the plurality of first through nth latches is further configured to independently receive the corresponding one of the first through nth bits of write data.

13. The device of claim 11, wherein the plurality of first through nth latches is configured within a page buffer associated with the memory cell.

14. The device of claim 11, wherein the plurality of first through nth latches is configured in cache memory within the semiconductor memory device.

15. The device of claim 11, wherein the memory cell is a non-volatile memory cell.

16. The device of claim 11, wherein the plurality of first through nth latches is arranged in a stacked relationship, such that each successive kth bit of write data is received and latched in the first latch and each k−1th bit of write data is transferred from the first latch to a second latch before receiving the kth bit of write data in the first latch.

17. The semiconductor memory device of claim 11, wherein the semiconductor memory device further comprising:
a plurality of multi-level memory cells.

* * * * *